(12) United States Patent
Maayan et al.

(10) Patent No.: US 7,512,009 B2
(45) Date of Patent: Mar. 31, 2009

(54) METHOD FOR PROGRAMMING A REFERENCE CELL

(75) Inventors: Eduardo Maayan, Kfar Saba (IL); Ron Eliyahu, Herzelia (IL); Ameet Lann, Macabim (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 187 days.

(21) Appl. No.: 11/413,962

(22) Filed: Apr. 27, 2006

(65) Prior Publication Data
US 2006/0268621 A1   Nov. 30, 2006

Related U.S. Application Data

(62) Division of application No. 10/454,820, filed on Jun. 5, 2003, now Pat. No. 7,064,983, which is a division of application No. 09/827,757, filed on Apr. 5, 2001, now Pat. No. 6,584,017.

(51) Int. Cl.
*G11C 11/00* (2006.01)
(52) U.S. Cl. .............................. 365/185.2; 365/185.22; 365/185.18; 365/185.24; 365/185.29
(58) Field of Classification Search .............. 365/185.2, 365/185.22, 185.18, 185.24, 185.29
See application file for complete search history.

(56) References Cited

U.S. PATENT DOCUMENTS

| | | | |
|---|---|---|---|
| 3,881,180 A | 4/1975 | Gosney, Jr. |
| 3,952,325 A | 4/1976 | Beale et al. |
| 4,145,703 A | 3/1979 | Blanchard et al. |
| 4,247,861 A | 1/1981 | Hsu et al. |
| 4,373,248 A | 2/1983 | McElroy |
| 4,386,417 A | 5/1983 | Collins et al. |
| 4,404,747 A | 9/1983 | Collins |
| 4,435,786 A | 3/1984 | Tickle |
| 4,494,016 A | 1/1985 | Ransom et al. |

(Continued)

FOREIGN PATENT DOCUMENTS

EP    0 822 557    2/1998

(Continued)

OTHER PUBLICATIONS

Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.

(Continued)

*Primary Examiner*—Viet Q Nguyen
(74) *Attorney, Agent, or Firm*—EMPK & Shiloh, LLP (57) ABSTRACT

A method for programming one or more reference cells is described. The reference cell is programmed a predetermined amount, its program state is sensed relative to a prescribed cell on the same die (e.g., a memory cell or a golden bit cell), and the programming process continues until the reference cell fails a preselected read operation. In one preferred embodiment, the memory cell used during the reference cell programming process is the cell in the memory array having the highest native threshold value. In another preferred embodiment, the memory cell used during the reference cell programming process is a native cell that is on-board the die containing the memory array, but not a cell within the memory array.

2 Claims, 5 Drawing Sheets

U.S. PATENT DOCUMENTS

| | | |
|---|---|---|
| 4,507,673 A | 3/1985 | Aoyama |
| 4,613,956 A | 9/1986 | Paterson et al. |
| 4,663,645 A | 5/1987 | Komori et al. |
| 4,665,426 A | 5/1987 | Allen et al. |
| 4,672,409 A | 6/1987 | Takei et al. |
| 4,733,105 A | 3/1988 | Shin et al. |
| 4,758,869 A | 7/1988 | Eitan et al. |
| 4,760,555 A | 7/1988 | Gelsomini et al. |
| 4,780,424 A | 10/1988 | Holler et al. |
| 4,839,705 A | 6/1989 | Tigelaar et al. |
| 4,857,770 A | 8/1989 | Partovi et al. |
| 4,916,671 A | 4/1990 | Ichiguchi |
| 4,961,010 A | 10/1990 | Davis |
| 4,992,391 A | 2/1991 | Wang |
| 5,029,063 A | 7/1991 | Lingstaedt et al. |
| 5,081,371 A | 1/1992 | Wong |
| 5,086,325 A | 2/1992 | Schumann et al. |
| 5,094,968 A | 3/1992 | Schumann et al. |
| 5,117,389 A | 5/1992 | Yiu |
| 5,120,672 A | 6/1992 | Mitchell et al. |
| 5,142,495 A | 8/1992 | Canepa |
| 5,168,334 A | 12/1992 | Mitchell et al. |
| 5,172,338 A * | 12/1992 | Mehrotra et al. ........ 365/185.03 |
| 5,204,835 A | 4/1993 | Eitan |
| 5,237,213 A | 8/1993 | Tanoi |
| 5,260,593 A | 11/1993 | Lee |
| 5,268,861 A | 12/1993 | Hotta |
| 5,280,420 A | 1/1994 | Rapp |
| 5,295,092 A | 3/1994 | Hotta |
| 5,327,383 A * | 7/1994 | Merchant et al. ........ 365/185.24 |
| 5,334,555 A | 8/1994 | Sugiyama et al. |
| 5,338,954 A | 8/1994 | Shimoji |
| 5,352,620 A | 10/1994 | Komori et al. |
| 5,357,134 A | 10/1994 | Shimoji |
| 5,366,915 A | 11/1994 | Kodama |
| 5,375,094 A | 12/1994 | Naruke |
| 5,386,388 A * | 1/1995 | Atwood et al. ......... 365/185.22 |
| 5,400,286 A | 3/1995 | Chu et al. |
| 5,402,374 A | 3/1995 | Tsuruta et al. |
| 5,436,478 A | 7/1995 | Bergemont |
| 5,463,586 A * | 10/1995 | Chao et al. .................. 365/210 |
| 5,477,499 A | 12/1995 | Van Buskirk et al. |
| 5,490,110 A * | 2/1996 | Sawada et al. ......... 365/185.03 |
| 5,495,440 A | 2/1996 | Asakura |
| 5,523,972 A * | 6/1996 | Rashid et al. .......... 365/185.22 |
| 5,532,962 A * | 7/1996 | Auclair et al. ............... 365/201 |
| 5,534,804 A | 7/1996 | Woo |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,568,419 A | 10/1996 | Atsumi et al. |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee |
| 5,608,679 A | 3/1997 | Mi et al. |
| 5,612,642 A | 3/1997 | McClinyock |
| 5,617,357 A | 4/1997 | Haddad et al. |
| 5,636,288 A | 6/1997 | Bonneville et al. |
| 5,638,320 A | 6/1997 | Wong et al. |
| 5,661,060 A | 8/1997 | Gill et al. |
| 5,663,907 A | 9/1997 | Frayer et al. |
| 5,672,959 A | 9/1997 | Der |
| 5,675,280 A | 10/1997 | Nomura |
| 5,675,537 A | 10/1997 | Bill et al. |
| 5,683,925 A | 11/1997 | Irani et al. |
| 5,696,929 A | 12/1997 | Hasbun et al. |
| 5,708,608 A | 1/1998 | Park et al. |
| 5,715,193 A | 2/1998 | Norman |
| 5,717,581 A | 2/1998 | Canclini |
| 5,726,946 A | 3/1998 | Yamagata et al. |
| 5,751,037 A | 5/1998 | Aozasa et al. |
| 5,760,634 A | 6/1998 | Fu |
| 5,768,184 A | 6/1998 | Hayashi et al. |
| 5,768,192 A | 6/1998 | Eitan |
| 5,774,395 A | 6/1998 | Richart et al. |
| 5,781,476 A | 7/1998 | Seki et al. |
| 5,781,478 A | 7/1998 | Takeuchi et al. |
| 5,784,314 A | 7/1998 | Sali et al. |
| 5,808,506 A | 9/1998 | Tran |
| 5,815,435 A | 9/1998 | Van Tran |
| 5,822,256 A | 10/1998 | Bauer et al. |
| 5,825,683 A | 10/1998 | Chang |
| 5,828,601 A | 10/1998 | Hollmer et al. |
| 5,835,935 A | 11/1998 | Estakhri et al. |
| 5,861,771 A | 1/1999 | Matsuda et al. |
| 5,862,076 A | 1/1999 | Eitan |
| 5,875,128 A | 2/1999 | Ishizuka |
| 5,877,537 A | 3/1999 | Aoki |
| 5,880,620 A | 3/1999 | Gitlin et al. |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,920,503 A | 7/1999 | Lee et al. |
| 5,920,507 A | 7/1999 | Takeuchi et al. |
| 5,930,195 A | 7/1999 | Komatsu |
| 5,933,366 A | 8/1999 | Yoshikawa |
| 5,933,367 A | 8/1999 | Matsuo et al. |
| 5,946,258 A | 8/1999 | Evertt et al. |
| 5,966,603 A | 10/1999 | Eitan |
| 5,990,526 A | 11/1999 | Bez et al. |
| 5,999,494 A | 12/1999 | Holzrichter |
| 6,000,006 A | 12/1999 | Bruce et al. |
| 6,002,614 A | 12/1999 | Banks |
| 6,005,423 A | 12/1999 | Schultz |
| 6,005,805 A | 12/1999 | Takeuchi |
| 6,037,627 A | 3/2000 | Kitamura et al. |
| 6,040,610 A | 3/2000 | Noguchi et al. |
| 6,064,226 A | 5/2000 | Earl |
| 6,064,251 A | 5/2000 | Park |
| 6,074,916 A | 6/2000 | Cappelletti |
| 6,075,402 A | 6/2000 | Ghilardelli et al. |
| 6,078,518 A | 6/2000 | Chevallier |
| 6,081,456 A | 6/2000 | Dadashev |
| 6,094,095 A | 7/2000 | Murray et al. |
| 6,107,862 A | 8/2000 | Mukainakano et al. |
| 6,117,714 A | 9/2000 | Beatty |
| 6,118,207 A | 9/2000 | Ormerod et al. |
| 6,122,198 A | 9/2000 | Haddad et al. |
| 6,128,226 A | 10/2000 | Eitan et al. |
| 6,128,227 A | 10/2000 | Kim |
| 6,130,572 A | 10/2000 | Ghilardelli et al. |
| 6,130,574 A | 10/2000 | Bloch et al. |
| 6,133,095 A | 10/2000 | Eitan et al. |
| 6,134,156 A | 10/2000 | Eitan |
| 6,137,718 A | 10/2000 | Reisinger |
| 6,150,800 A | 11/2000 | Kinoshita et al. |
| 6,154,081 A | 11/2000 | Pakkala et al. |
| 6,156,149 A | 12/2000 | Cheung et al. |
| 6,157,242 A | 12/2000 | Fukui |
| 6,163,484 A | 12/2000 | Uekubo |
| 6,175,523 B1 | 1/2001 | Yang et al. |
| 6,181,597 B1 | 1/2001 | Nachumovsky |
| 6,188,211 B1 | 2/2001 | Rincon-Mora et al. |
| 6,195,196 B1 | 2/2001 | Kimura et al. |
| 6,198,342 B1 | 3/2001 | Kawai |
| 6,205,059 B1 | 3/2001 | Gutala et al. |
| 6,208,200 B1 | 3/2001 | Arakawa |
| 6,208,557 B1 | 3/2001 | Bergemont et al. |
| 6,214,666 B1 | 4/2001 | Mehta |

| | | |
|---|---|---|
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,290 B1 | 4/2001 | Chang et al. |
| 6,222,762 B1 | 4/2001 | Guterman et al. |
| 6,229,734 B1 | 5/2001 | Watanabe |
| 6,246,555 B1 | 6/2001 | Tham |
| 6,252,442 B1 | 6/2001 | Malherbe |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,285,246 B1 | 9/2001 | Basu |
| 6,285,614 B1 | 9/2001 | Mulatti et al. |
| 6,297,096 B1 | 10/2001 | Boaz |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,346,442 B1 | 2/2002 | Aloni et al. |
| 6,348,381 B1 | 2/2002 | Jong |
| 6,353,356 B1 | 3/2002 | Liu |
| 6,353,555 B1 | 3/2002 | Jeong |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,421,277 B2 | 7/2002 | Tsunesada |
| 6,426,898 B1 | 7/2002 | Mihnea et al. |
| 6,429,063 B1 | 8/2002 | Eitan |
| 6,433,624 B1 | 8/2002 | Grossnickle et al. |
| 6,436,766 B1 | 8/2002 | Rangarajan et al. |
| 6,436,768 B1 | 8/2002 | Yang et al. |
| 6,438,035 B2 | 8/2002 | Yamamoto et al. |
| 6,440,797 B1 | 8/2002 | Wu et al. |
| 6,445,030 B1 | 9/2002 | Wu et al. |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,472,706 B2 | 10/2002 | Widdershoven et al. |
| 6,490,204 B2 | 12/2002 | Bloom et al. |
| 6,493,266 B1 | 12/2002 | Yachareni et al. |
| 6,512,701 B1 | 1/2003 | Hamilton et al. |
| 6,519,180 B2 | 2/2003 | Tran et al. |
| 6,528,390 B2 | 3/2003 | Komori et al. |
| 6,532,173 B2 | 3/2003 | Lioka et al. |
| 6,535,020 B1 | 3/2003 | Yin |
| 6,535,434 B2 * | 3/2003 | Maayan et al. ......... 365/189.07 |
| 6,537,881 B1 | 3/2003 | Rangarjan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 * | 6/2003 | Maayan et al. ......... 365/185.22 |
| 6,593,606 B1 | 7/2003 | Randolph et al. |
| 6,608,526 B1 | 8/2003 | Sauer |
| 6,614,295 B2 | 9/2003 | Tsuchi |
| 6,614,686 B1 | 9/2003 | Kawamura |
| 6,614,692 B2 | 9/2003 | Maayan et al. |
| 6,617,179 B1 | 9/2003 | Kim |
| 6,617,215 B1 | 9/2003 | Halliyal et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,956 B1 | 10/2003 | Mitani |
| 6,639,271 B1 | 10/2003 | Zheng et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,181 B2 | 11/2003 | Sofer et al. |
| 6,645,801 B1 | 11/2003 | Ramsbey et al. |
| 6,649,972 B2 | 11/2003 | Eitan |
| 6,653,190 B1 | 11/2003 | Yang et al. |
| 6,653,191 B1 | 11/2003 | Yang et al. |
| 6,654,296 B2 | 11/2003 | Jang et al. |
| 6,664,588 B2 | 12/2003 | Eitan |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,788,579 B2 | 9/2004 | Gregori et al. |
| 6,791,396 B2 | 9/2004 | Shor et al. |
| 6,794,249 B2 | 9/2004 | Palm et al. |
| 6,831,872 B2 | 12/2004 | Matsuoka |
| 6,836,431 B2 | 12/2004 | Chang |
| 6,871,258 B2 | 3/2005 | Micheloni et al. |
| 6,885,585 B2 | 4/2005 | Maayan et al. |
| 6,912,160 B2 | 6/2005 | Yamada |
| 6,917,544 B2 | 7/2005 | Maayan et al. |
| 6,928,001 B2 | 8/2005 | Avni et al. |
| 6,937,523 B2 | 8/2005 | Eshel |
| 6,967,872 B2 | 11/2005 | Quader et al. |
| 6,996,692 B2 | 2/2006 | Kouno |
| 7,064,983 B2 * | 6/2006 | Maayan et al. ........... 365/185.2 |
| 7,079,420 B2 | 7/2006 | Shappir et al. |
| 2001/0006477 A1 | 7/2001 | Banks |
| 2002/0004921 A1 | 1/2002 | Muranaka et al. |
| 2002/0064911 A1 | 5/2002 | Eitan |
| 2002/0140109 A1 | 10/2002 | Keshavarzi et al. |
| 2002/0145465 A1 | 10/2002 | Shor et al. |
| 2002/0145911 A1 | 10/2002 | Maayan et al. |
| 2002/0145918 A1 | 10/2002 | Maayan et al. |
| 2002/0199065 A1 | 12/2002 | Subramoney et al. |
| 2003/0001213 A1 | 1/2003 | Lal |
| 2003/0002348 A1 | 1/2003 | Chen et al. |
| 2003/0076710 A1 | 4/2003 | Sofer et al. |

| | | | |
|---|---|---|---|
| 2003/0134476 A1 | 7/2003 | Rolzin et al. | |
| 2003/0145176 A1 | 7/2003 | Dvir et al. | |
| 2003/0145188 A1 | 7/2003 | Cohen et al. | |
| 2003/0155659 A1 | 8/2003 | Verma et al. | |
| 2003/0190786 A1 | 10/2003 | Ramsbey et al. | |
| 2003/0197221 A1 | 10/2003 | Shinozaki et al. | |
| 2003/0202411 A1 | 10/2003 | Yamada | |
| 2003/0206435 A1 | 11/2003 | Takahashi | |
| 2003/0209767 A1 | 11/2003 | Takahashi et al. | |
| 2003/0218207 A1 | 11/2003 | Hashimoto et al. | |
| 2003/0218913 A1 | 11/2003 | Le et al. | |
| 2003/0222303 A1 | 12/2003 | Fukuda et al. | |
| 2003/0227796 A1 | 12/2003 | Miki et al. | |
| 2004/0014290 A1 | 1/2004 | Yang et al. | |
| 2004/0021172 A1 | 2/2004 | Zheng et al. | |
| 2004/0027858 A1 | 2/2004 | Takahashi et al. | |
| 2004/0047198 A1 | 3/2004 | Lusky et al. | |
| 2004/0151034 A1 | 8/2004 | Shor et al. | |
| 2004/0153621 A1 | 8/2004 | Polansky et al. | |
| 2004/0157393 A1 | 8/2004 | Hwang | |
| 2004/0222437 A1 | 11/2004 | Avni et al. | |
| 2005/0117395 A1 | 6/2005 | Maayan et al. | |
| 2005/0140405 A1 | 6/2005 | Do et al. | |
| 2006/0084219 A1 | 4/2006 | Lusky et al. | |

FOREIGN PATENT DOCUMENTS

| | | |
|---|---|---|
| EP | 0 843 398 | 5/1998 |
| EP | 0580467 | 9/1998 |
| EP | 0461764 | 7/2000 |
| EP | 1 091 418 | 4/2001 |
| EP | 1 207 552 | 5/2002 |
| EP | 1 223 586 | 7/2002 |
| EP | 1 365 452 | 11/2003 |
| EP | 001217744 | 3/2004 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 05-326893 | 12/1993 |
| JP | 06151833 | 5/1994 |
| JP | 06-232416 | 8/1994 |
| JP | 09-017981 | 1/1997 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 01/65566 | 9/2001 |
| WO | WO 01/65567 | 9/2001 |
| WO | WO 02/43073 | 5/2002 |
| WO | WO 03/032393 | 4/2003 |
| WO | WO 03/054964 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088353 | 10/2003 |

OTHER PUBLICATIONS

P-N Junction Diode, Physics of semiconductor devices, 1981, Ch. 2, "A Wiley-Interscience Publication", John Wiley & Sons Publishers.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehighuniv.pdf.

Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/Index.html.

"Semiconductor Memory: Non-Volatile Memory (NVM)", National University of Singapore, Department of Electrical and Computer Engineering: http://ece.edu.sg/stfpage/elezhucx/myweb/NVM.pdf.

"Saifun Non-Volatile Memory Technology", 1st Edition, 2005, published and written by Saifun Semiconductors Ltd. 1110 pgs.

Jung et al., IEEE Journal of Solid-State Circuits, Nov., 1996, 1575-1583, vol. 31, No. 11.

Campardo et al., IEEE Journal of Solid-State Circuits, Nov., 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Martin, Improved Circuits for the Realization of Switched-Capacitor Filters, IEEE Transactions on Circuits and Systems, Apr., 1980, 237-244, vol. CAS-27.

Umezawa et al., A 5-V Only Operation 0.6-μm Flash EEPROM with Row Decoder Scheme in Triple-Well Structure, IEEE Journal of Solid-State Circuits, 1992, 1540, vol. 27.

Mitchell et al., A new self-aligned planar array cell for ultra high density EPROMS, 1987.

Esquivel et al., High Density Contactless, Self Aligned EPROM Cell Array Technology, 1986.

Allen et al., CMOS Analog Circuit Design, 2002, 259 pages, Oxford University Press.

Klinke et al., A very-high-slew-rate CMOS operational amplifier, IEEE Journal of Solid-State Circuits, 1989, 744-746, vol. 24.

Shor et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, pp. 226-236, vol. 38.

* cited by examiner

METHOD FOR PROGRAMMING A REFERENCE CELL

CROSS-REFERENCE TO RELATED APPLICATIONS

The present application is a divisional application of U.S. Ser. No. 10/454,820, filed Jun. 5, 2003 now U.S. Pat. No. 7,064,983, which is herein incorporated by reference, which application is a divisional application of U.S. Ser. No. 09/827,757, filed Apr. 5, 2001, entitled "Reference Programming" (now issued as U.S. Pat. No. 6,584,017), which is herein incorporated by reference.

This application is related to U.S. Pat. No. 6,128,226, issued Oct. 3, 2000 entitled "Method and Apparatus for Operating with a Close to Ground Signal," to U.S. Pat. No. 6,134,156, issued Oct. 17, 2000 entitled "Method for Initiating a Retrieval Procedure in Virtual Ground Arrays," to U.S. Pat. No. 6,535,434, issued Mar. 18, 2003 entitled "Architecture And Scheme For A Non-Strobed Read Sequence," and U.S. Pat. No. 6,490,204, issued Dec. 3, 2002, entitled "Programming and Erasing Methods For A Reference Cell Of An NROM Array," the foregoing patents and patent applications being incorporated by reference in their entireties as if set forth herein.

FIELD OF THE INVENTION

The present invention relates to sensing schemes for read operations on semiconductor devices, and, more particularly, to a method for programming a reference cell for use in a read operation.

BACKGROUND OF THE INVENTION

Memory devices, such as random access memory (RAM), read-only memory (ROM), non-volatile memory (NVM) and like, are known in the art. These devices provide an indication of the data which is stored therein by providing an output electrical signal. A device called a sense amplifier is used for detecting the signal and determining the logical content thereof. U.S. Pat. No. 4,916,671 to Ichiguchi describes one such sense amplifier.

In general, prior art sense amplifiers determine the logical value stored in a cell by comparing the output of the cell with a fixed reference voltage level. The aforementioned U.S. Pat. Nos. 6,134,156 and 6,128,226 describe an alternative circuit architecture in which a reference cell is used to generate a reference signal in lieu of a fixed reference voltage value.

When a memory cell is programmed or erased, the signal it generates differs from the reference signal by some margin. Since reading the cell's state should always result the same (i.e., either programmed or erased depending on the cell's state), introducing such margin is necessary to overcome imperfections in the reading process and to compensate for drifts in the cell's threshold voltage (e.g., caused by retention loss or disturbs). A reduction in the original margin due to imperfections in the reading process (e.g., due to operation at different operational conditions) is referred to as "margin loss."

It is well understood that the placement of a reference signal to which an array cell signal can be compared during sensing can be achieved in a number of ways. When close to ground signals are sensed as in the aforementioned U.S. Pat. Nos. 6,134,156 and 6,128,226 patents, the reference cell signal develops at an intermediate rate between that of a programmed cell and an erased cell. When set this way, the array cells' signals on one side of the reference signal are determined to be programmed cells, while signals on the other side of the reference signal are determined to be erased cells. For example, array cells generating signals smaller than the reference signal are considered to be programmed and array cells generating signals larger than the reference signal are considered to be erased. Conventionally, such placement is achieved by using a reference cell whose current is between the erased and programmed cells' current levels. The reference cell's current level can be controlled by the reference cell's size, its programming level, or its gate voltage level. Furthermore, if voltage signals are used to detect the cells' contents, then the reference signal placement can be controlled by providing a different load capacitance on the reference cell compared to that of the array cells. However, if the array and the reference cells differ in their sizes, in their operating gate voltages, or in their loads then some margin loss will be introduced to the sensing scheme. On the other hand, placing the reference cells' signals by properly programming the reference cells (while operating the array and reference cells at identical conditions) minimizes the sensing scheme sensitivity to operating conditions, process parameters and environmental conditions variations, thereby minimizing the margin loss, if any, that is introduced to the sensing system.

When reference cell placement is by programming, it must be programmed a precise amount in order to achieve its intended purpose. There are difficulties attendant with reliable programming of a reference cell so as to minimize operating margin loss, as well as accurate placement of a programmed reference cell relative to the memory array cells. The present invention provides a method for programming reference cells to minimize margin loss and maximize cycling performance.

SUMMARY OF THE PRESENT INVENTION

The present invention provides a method for programming one or more reference cells, with the programming being performed relative to a prescribed cell on the same die as the reference cell (e.g., a memory cell or a golden bit cell).

According to one aspect of the invention, a method for programming a reference cell for use in an integrated circuit memory having an array of memory cells each exhibiting a native threshold voltage value is described. That method comprising the steps of first locating an address for the memory cell in the array that has the highest native threshold voltage value (VTNH). A reference cell is programmed a predetermined amount and its program state is sensed relative to the VTNH memory cell. The programming and sensing steps are repeated until the sensing step indicates that the reference cell has been programmed an amount sufficient to fail a first preselected read operation.

In a more particular methodology in accordance with this aspect of the invention, the locating step can include the steps of iteratively increasing a gate voltage applied to the memory cells and performing the first preselected read operation at each such applied gate voltage until a final gate voltage is identified at which all the memory cells in the array pass the first preselected read operation. Further, the first preselected read operation can exclude memory cells that have already passed the first preselected read operation at a previously applied gate voltage.

According to another aspect of the invention, a method for programming a reference cell for use in an integrated circuit memory having a plurality of memory cells each exhibiting a native threshold voltage value is described. That method locates an address for the VTNH cell by applying a first gate voltage value at which at least one memory cell fails a first preselected read operation and increasing the applied gate voltage until a final gate voltage value is reached at which each of the memory cells can just pass the first preselected read operation. The reference cell is programmed a predetermined amount and the program state of the reference cell relative to the VTNH memory cell is sensed by performing a second preselected read operation on the reference cell. The programming and sensing steps are repeated until the sensing step indicates that the reference cell has been programmed an amount sufficient to fail the second preselected read operation.

According to still another aspect of the invention, a method for programming a set of reference cells for use in performing respective read operations on an integrated circuit memory having a plurality of memory cells is described. That method locates the VTNH cell, determines a placement for a reference voltage read signal relative to the VTNH cell, places a reference voltage erase verify signal relative to the reference voltage read signal, and places a reference voltage program verify signal relative to the reference voltage read signal.

The foregoing methods can have their sensing steps performed relative to the VTNH memory cell and also relative to a native cell (a golden bit cell) on-board the same die.

The inventive method can be utilized to program a reference cell used with a memory array, a sliced array having one or more columns of memory cells, and redundant or auxiliary arrays.

These and other more specific aspects and features of the present invention can be appreciated from the acompanying Drawing Figures and Detailed Description of Certain Preferred Embodiments.

BRIEF DESCRIPTION OF THE DRAWINGS

The present invention will be understood and appreciated more fully from the following detailed description taken in conjunction with the drawings in which.

DETAILED DESCRIPTION OF CERTAIN PREFERRED EMBODIMENTS

By way of overview and introduction, the present invention is described in connection with a methodology for programming a reference cell to enable sensing of the contents of a memory cell from close to ground level. Such a memory array is described in the aforementioned U.S. Pat. No. 6,134,156 and U.S. application Ser. No. 09/827,756, filed on even date herewith, entitled "Architecture And Scheme For A Non-Strobed Read Sequence." By using a reference cell instead of a fixed threshold for comparison, a low voltage signal can be reliably processed irrespective of any changes in temperature or power supply level. The present invention has applicability to other sensing schemes, including A.C. and D.C. sensing techniques, and with read operations from either the source or drain side of a transistor, as can be appreciated by those of skill in the art.

Figure 1:
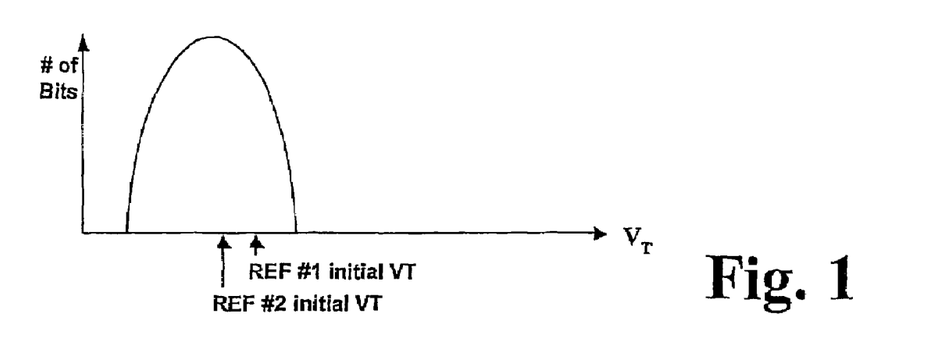
FIG. 1 illustrates a spread of native threshold voltage values for a number of memory cells on a die.

Reference is made to FIG. 1 which illustrates the memory array cells native threshold voltage distribution. The memory cells on the die include both array cells that are addressed in a conventional manner, and additional cells such as auxiliary and reference cells that are used for a variety of purposes including quality control during manufacturing and read operations when the array cells are put into service. The native reference cells can lie anywhere along the threshold voltage (VT) axis. By way of example, the native threshold values for two reference cells are indicated as lying within the distribution curve, though that is not required.

The methods of the present invention enable precision programming of reference cells relative to a memory cell on the die, for example, relative to an array cell, another reference cell, or to a golden bit. Each of these techniques defines a related but different method described herein with reference to a flow diagram of a preferred embodiment for each such technique. These techniques are performed after manufacturing the devices, prior to placing the memory array into service. Generally, there are a number of target threshold voltage values that are set in a corresponding number of reference cells as a result of the reference cell programming process of the invention. That is to say, different types of read operations can be performed on the memory cell such as program verify, erase verify and operations in which temporary states of a cell in the progress of an erase or a program operation should be detected. The basic difference presented by these in-progress read cycles is the placement of the reference cell signal. Since the reference cell's state is not changed according to the type of the read operation, different reference cells should be used for each of these types of operations.

Figure 2:
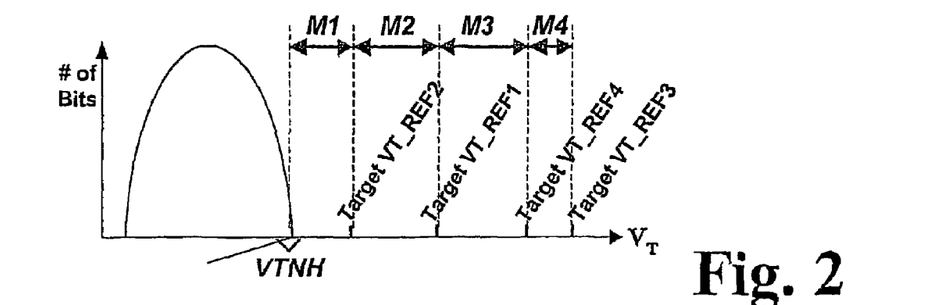
FIG. 2 illustrates target threshold voltage values for programming reference cells in order to achieve exemplary and desired operating margins.

As illustrated in FIG. 2, target threshold voltage values are spaced relative to one another by predetermined margins M1, M2, M3 and M4 which are established to ensure reliable reads, read verifies, erase verifies, program verifies, or other read operations on the array memory cells. To minimize margin loss and maximize product endurance and reliability, it is critical that the margins M1 ... M4 provide a reliable buffer and a tight operating window. As well, it is essential that the placement of the programmed reference cells is defined (at least for one of the reference cells) relative to the array threshold voltages (VT) distribution.

FIG. 2 illustrates an example of the margins M1 ... M4 established and positioned relative to the memory cell in the array having the highest native threshold value ("VTNH"). As will be appreciated from the discussion below, the margins can be established and positioned relative to any cell, such as the VTNH cell, a golden bit cell, or another reference cell.

Figure 2A:
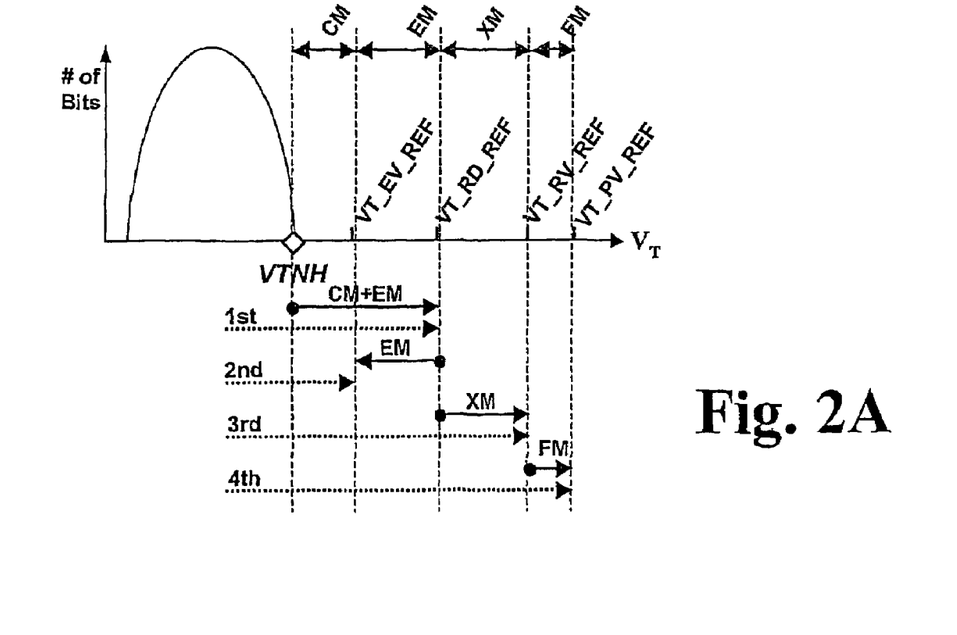
FIG. 2A illustrates a practical example of operating margins and a preferred sequence of steps to establish the operating margins relative to a particular cell within the memory array.

FIG. 2A illustrates a practical example of the margins M1 ... M4 that can be well defined using the techniques of the present invention. Four margins are illustrated: cycling margin ("CM"), erase margin ("EM"), retention margin ("XM") and refresh margin ("FM"). These margins are maintained between the reference cells, once their threshold voltage value have been programmed. In other words, the margins are controlled based on the response of each reference cell when driven by a standard voltage source VCCR. Since the reference programming procedure results in reference threshold voltages that may not be exactly as the original target levels, it is necessary that the actual reference cells threshold voltages maintain the following margins:

VT_RD_REF_actual−VTNH>=CM+EM

VT_RD_REF_actual−VT_EV_REF_actual>=EM

VT_RV_REF_actual−VT_RD_REF_actual>=XM

VT_PV_REF_actual−VT_RV_REF_actual>=FM where VT_RD_REF_actual is the threshold voltage value of a reference cell programmed to implement a cell-contents read operation, VT_EV_REF_actual is the threshold voltage value of a reference cell programmed to implement an erase verify operation concerning the contents of a cell, VT_RV_REF_actual is the threshold voltage value of a reference cell programmed to implement a refresh verify operation concerning the contents of a cell, and VT_PV_REF_actual is the threshold voltage value of a reference cell programmed to implement a program verify operation concerning the contents of a cell.

FIG. 2A also illustrates a preferred sequence of steps to establish the operating margins relative to a particular cell within the memory array. The steps in FIG. 2A are shown relative to the VTNH cell, though other cells can be used such as the golden bit cell, as described below. Use of the VTNH cell facilitates discussion because it clearly illustrates the relationship between the required threshold voltages to be programmed into the reference cells and the required operating margins. Thus, with reference to the VTNH cell, a reference cell is programmed to be the RD_REF cell by programming it to have a margin M of CM+EM above VTNH. If a golden bit cell were used as the base line threshold voltage, then the margin M would most likely be greater by the difference between the threshold voltage of the golden bit cell (V_OTPG) and the VTNH cell.

Next, another reference cell is programmed to be the erase verify cell by programming that cell to have a margin EM below the actual threshold voltage of the RD_REF cell, as can be appreciated from FIG. 2A. Likewise, the RV_REF cell can be programmed to be XM above the actual threshold voltage of the RD_REF cell, and another cell is programmed to be the PV_REF cell by programming it to have a margin FM above the actual threshold voltage of the RV_REF. It will be appreciated that other arrangements of the reference cells' threshold voltages and of the sequence of programming the reference cells are possible and are part of the present invention. Furthermore, the placement of each reference cell can be made relative to an array cell, a "golden" cell, or another reference cell.

Figure 3A:
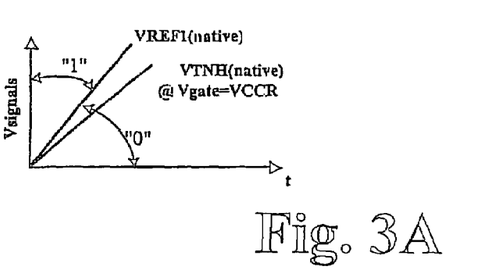
FIG. 3A plots signal development through an array cell and a reference cell when both are driven by the same VCCR voltage supply.
Figure 3B:
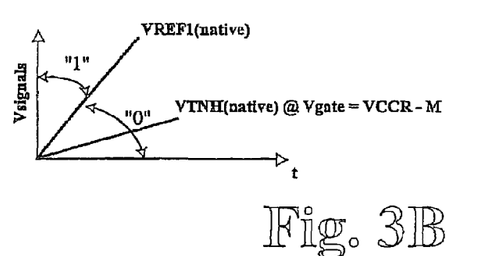
FIG. 3B is the plot of FIG. 3A, showing the array cell being driven by a trimmed external supply voltage.
Figure 3C:
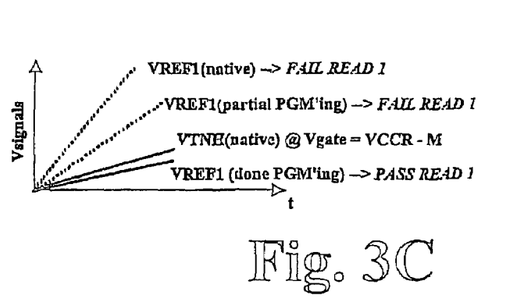
FIG. 3C is the plot of FIG. 3B, showing the reference cell at various program states and the results of the read operations.

When put into service, it is desirable to drive both the array cells' and the reference cells' gates with the same voltage supply VCCR during all standard read operations. However, during reference programming, a trimmable external voltage supply (EXT_VCCR) driving the array cells' gates can be used to facilitate the reference cell programming procedure. The effect of trimming the external supply is illustrated in FIGS. 3A, 3B and 3C. In FIG. 3A, the development over time of voltage signals from a given, native reference cell is plotted together with the VTNH cell when both are driven by VCCR. We can define a "pass read '1'" operation to be when the array cell has a greater signal than the reference cell and a "fail read '1.'" operation to be when the array cell signal is lower than the reference signal. For example, the result of a read operation between the native VTNH cell and the native reference cell shown in FIG. 3A will be "fail read '1'".

In FIG. 3B, the gate voltage applied to the VTNH cell has been reduced by a margin M, and the lower gate voltage results in slower signal development in that cell. Consequently, when compared to VTNH driven at the trimmed supply voltage level, the reference cell REF1 (driven by the standard gate voltage VCCR) must be programmed further in order to fail the read '1' operation. FIG. 3C illustrates the reference cell REF1 at various program states along the process of being programmed including its native state in which it fails the read '1' operation, an interim state in which the cell REF1 has been partially programmed, yet still fails the read '1' operation, and a state in which the further programmed reference cell signal is smaller than the array cell's signal and so it passes the read '1' test. At this last state, it is ensured that the threshold voltage of the reference cell has been raised by at least the M margin.

A read operation or "sensing" of a cell can be performed as described in the aforementioned, co-pending U.S. Pat. No. 6,535,434, issued Mar. 18, 2003, entitled "Architecture And Scheme For A Non-Strobed Read Sequence," which describes the steps taken to sense a close to ground signal and other sensing methods (e.g., DC current sensing).

Figure 4:
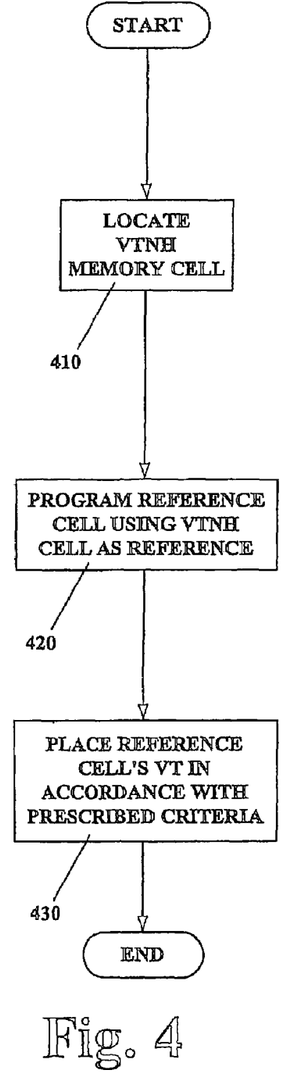
FIG. 4 illustrates an overall process for programming a selected reference cell according to a first preferred method of the present invention.

FIG. 4 illustrates the overall process for placing a selected reference cell with regard to a first preferred method of the present invention. At step 410, the VTNH memory cell within the memory cell array is located. That cell is then used as a reference for verifying the programming of the selected reference cell, as indicated at step 420. All margins are then established with respect to the threshold voltage for that cell, which is the highest threshold voltage of any cell in the memory array. This method places the VT for the selected reference cell by programming the cell in accordance with a prescribed criterion at step 430. Generally, the criterion is that the VT for the reference cell is VTNH+M, where M is a prescribed margin. As a specific example, if the selected reference cell is the RD_REF cell, then M is CM+EM and target reference cell VT is set to be greater than or equal to VTNH+CM+EM. The reference cell is preferably programmed a predetermined amount until placed, as described in detail with regard to the flow diagrams of FIGS. 5-8.

Figure 4A:
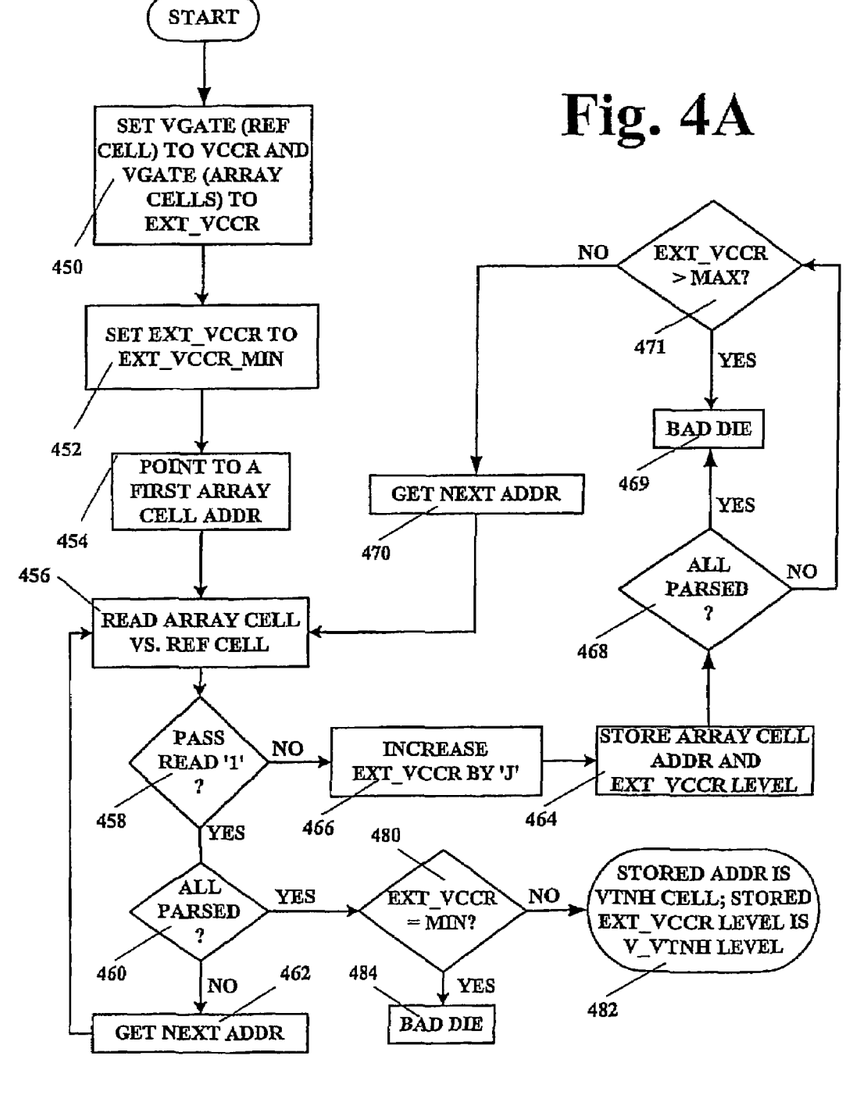
FIG. 4A illustrates a process for locating the memory cell within a memory array having the highest native threshold voltage value (denoted "VTNH") among the memory cells in the array.

With reference now to FIG. 4A, step 410 of FIG. 4 for locating the VTNH cell proceeds by first setting an initial, low voltage level (EXT_VCCR) that is externally applied to the gates of respective memory cells, in succession, as the array is parsed, as shown at step 450. Meanwhile, a predetermined gate voltage level such as the standard gate voltage level at read, VCCR, is applied to the gate of the reference cell. It will be recalled that the reference cell has a similar structure (e.g., size, access path, environment, etc.) to the array cells and has a matched load; thus, as was illustrated in FIG. 3B, the comparatively low voltage applied to the gate of the still native array cells by EXT_VCCR at step 452 causes the array cell to develop a smaller signal than the reference cell. The memory array is then parsed starting with a first array cell address, as shown at step 454.

At a prescribed moment after applying these gate voltages, for example, as described in the aforementioned patent application entitled "Architecture And Scheme For A Non-Strobed Read Sequence," a read operation is performed on consecutive memory cells in the array against the reference cell (see step 456) until a fail-to-read-1 condition is detected. Assuming that EXT_VCCR has been initially set to a low enough value (e.g., 2 Volts), then the first read operation is expected to fail a read '1' operation, as tested at step 458, since both cells are native and are expected to have similar characteristics. If the read does not fail "read '1'" (i.e., it passes), then if the entire array has not already been parsed, as tested at step 460, then the next array cell is selected at step 462 and the process is repeated, starting again at step 456, until a fail read '1' is detected. The address of the array cell that failed the test is stored as well as the EXT_VCCR level, at step 464. The voltage EXT_VCCR is increased at step 466, preferably by a fixed small increment J (typically smaller than 100 mV), and, if the array has not been completely parsed, as tested at step 468, this read operation is repeated starting from the next array cell address at step 470 until the fail read '1' is detected (at step 458). On the other hand, if the array has been completely parsed yet the present address has failed to read '1,' then the die is considered as a bad die, and the operator is advised of this at step 469. A bad die can also be detected if the level of EXT_VCCR has been incremented beyond a prescribed maximum, as shown at step 471. The maximum level for EXT_VCCR can be established based on empirical data for processing similar devices.

After an array cell address is stored at step 464 and a valid next address is obtained at step 470, further addresses are examined to determine whether EXT_VCCR must be incremented and to store a new array cell address. As additional array cells, if any, fail the read '1' test at step 458, the already stored address and EXT_VCCR level can be replaced by the present address and EXT_VCCR level for the presently read array cell, and the EXT_VCCR level can be increased again, with the process continuing from the next array cell address, assuming there are more addresses to parse (as tested at step 468).

As described above, if the read operation repeats starting at the last stored cell address and continues to pass the read '1' operation at step 458 then the last address of the array will eventually be reached, as tested at step 460. Once the entire array has already parsed, the flow proceeds to step 480 at which point a test is made to ensure that the die is not defective by examining the current setting for EXT_VCCR. If EXT_VCCR is above an established minimum setting, then the last stored address is the VTNH memory cell address because it was the last cell that failed to be read as a '1'. Also, the last stored level for EXT_VCCR is the V_VTNH level. These values are preserved for use in reference cell programming, as indicated at step 482. On the other hand, if EXT_VCCR is not above an established minimum level, the operator is advised that the die is defective, as indicated at step 484.

This process enables each cell to be read only once, in other words, a single parse of the array locates the VTNH memory cell address, as indicated at step 462. This is a preferred method although other flows for parsing the array can be used although they will probably result in a longer process due to the larger number of read operations (e.g., for each EXT_VCCR level start the read operations at a specific first address and parse the array till a fail read '1' is detected).

The increment step of the EXT_VCCR supply in this process determines the accuracy of the VTNH cell identification. Accuracy of identification means that there is no cell in the array whose threshold voltage is larger than VTNH plus the EXT_VCCR increment step level, where VTNH is the threshold voltage of the cell identified as the VTNH cell. Assume for example that a 100 mV increment step is used. At the end of the process, the stored address indicates the cell that failed read '1' at the stored EXT_VCCR level. The remaining cells that were read in the next loop of read cycles, applying to their gates the stored EXT_VCCR level plus the 100 mV increment step, pass the read '1' test (otherwise the address of the first failing one would have been stored). However, if a smaller increment step was used, for example 50 mV, then one of those remaining cells could have failed the read '1' test. Thus, if a more accurate identification of the VTNH cell is required, then either one of the following two options can be adopted:

1. Use a smaller EXT_VCCR increment step for the whole process.
2. Use a coarse EXT_VCCR increment step for a first pass of the whole array and a finer EXT_VCCR increment step for a second pass of the cells starting at the stored VTNH cell address.

A separate aspect of this procedure is that a final voltage value for EXT_VCCR which is arrived at once the array has been parsed provides an indication as to whether the threshold voltage of the reference cell or an array cell is outside of a standard distribution of values. This value is therefore useful in determining the quality of the memory array. If at the end of the process the final EXT_VCCR level is the starting level (EXT_VCCR_min) then this indicates that the reference cell threshold voltage is significantly larger than the array cells' threshold voltages. As well, by setting a maximum level for the EXT_VCCR supply (EXT_VCCR_max), if this level is reached then it indicates that the reference cell threshold voltage is significantly lower than at least one of the array cells' threshold voltages. Any indication of such non-standard distribution of threshold voltages can be used as a quality check and as a basis for a decision such as to reject the part (steps 469 and 484 in FIG. 4A).

Moreover, while the foregoing steps are operative to locate the VTNH memory cell, they also can serve as a blank test for the memory array, in which all cells are read once, and so the locating process does not increase the sort time during manufacturing.

Optionally, the final value of EXT_VCCR is stored, and, if desired, the value of EXT_VCCR at each cell at which a read '1' operation fails can be stored.

Figures 5, 6:
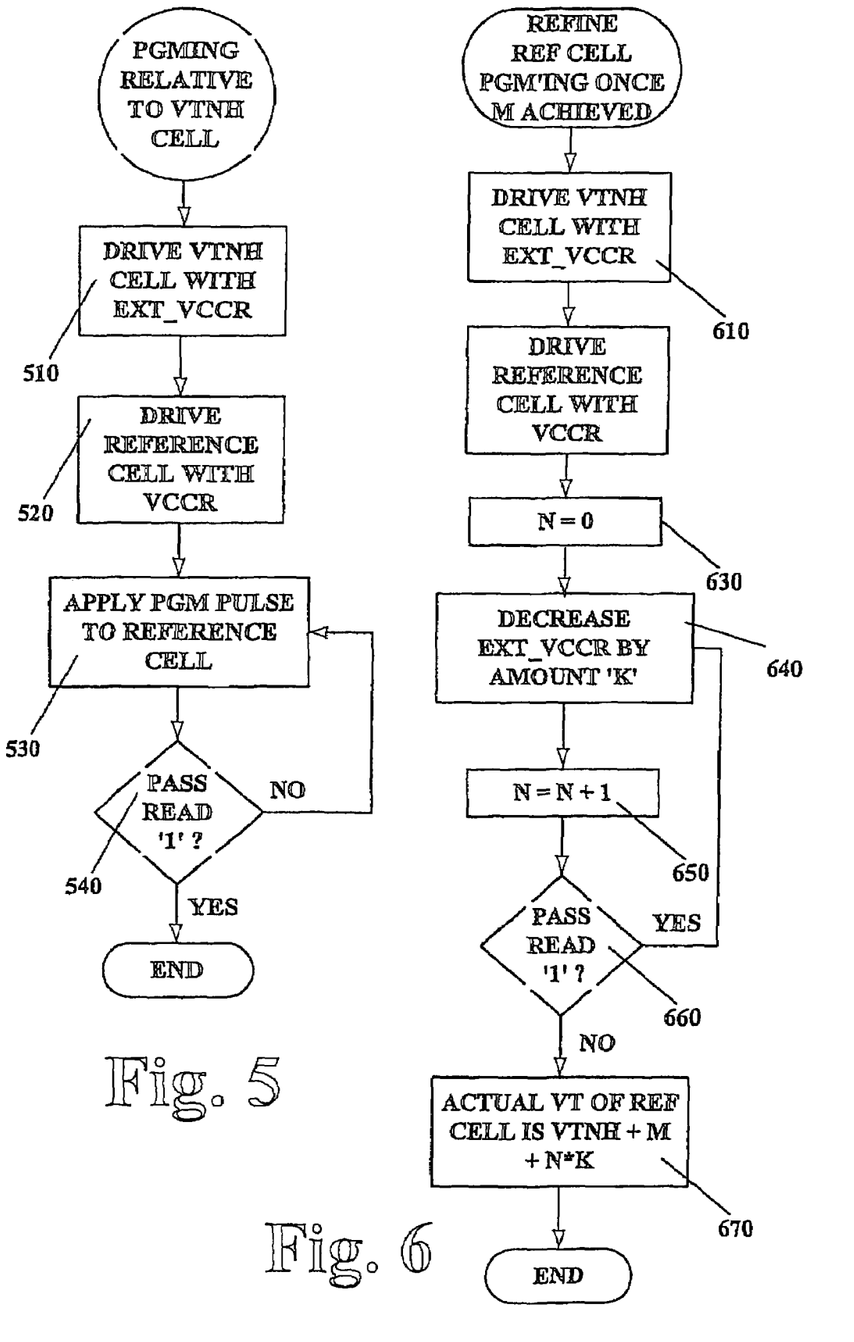
FIG. 5 illustrates a process for programming a selected reference cell to a target value in accordance with the first preferred method.
FIG. 6 illustrates a process for more accurately determining the threshold voltage of a reference cell placed in accordance with the embodiments of the present invention.

With reference now to FIG. 5, a process for programming a selected reference cell REF1 to a target value in accordance with the first preferred method is described. At step 510, the VTNH cell, once located, is driven by a trimmable voltage source EXT_VCCR at a voltage value of $$EXT\_VCCR = VCCR - M$$

where M is a prescribed margin suitable for the selected reference cell. For purposes of illustration, assume that the reference cell REF1 is the read reference cell RD_REF shown in FIG. 2A for which $$M = CM + EM.$$

Meanwhile, as indicated at step 520, the reference cell REF1 is driven with a standard supply voltage having a supply voltage value of VCCR. As should be appreciated, the trimmable voltage source EXT_VCCR permits the VTNH array cell signal to be temporarily placed at the target location of the reference cell REF1 signal, by applying a reduced gate voltage during this reference cell programming phase test as compared to the VCCR voltage ordinarily applied to the VTNH (and other array cells) when the memory cell is put into service.

At step 530, a program pulse is applied to the reference cell REF1. A test is then made at step 540 to determine whether the result of a read operation of the VTNH cell (driven by the trimmed gate voltage EXT_VCCR) against the reference cell REF1 (driven by the standard gate voltage at read, VCCR) is PASS read '1' or FAIL. This test is performed by sensing the program state of the reference cell relative to the VTNH cell (driven by the trimmed gate voltage EXT_VCCR) preferably using the standard sensing scheme that is used when the device is put into service. If it does not pass "read '1'", then the reference cell has not been programmed to the location at which the VTNH cell signal has been temporarily placed (by the trimmed gate voltage EXT_VCCR), and further programming pulses are required. The process loops back to step 530 so that an additional program pulse can be applied, and then a read test as at step 540 is again performed. The program pulses can be applied in a fixed increment (i.e., a predetermined amount), or an algorithm can be employed to enhance the process. For one suitable algorithm, see U.S. application Ser. No. 10/300,924, filed on even date herewith, entitled "Programming and Erasing Methods for A Reference Cell of An NROM Array," which application is a continuation-in-part application of U.S. application Ser. No. 09/730,586, filed Dec. 7, 2000, which is a continuation-in-part application of U.S. Ser. No. 09/563,923, filed May 4, 2000. The process flow ends when the test at step 540 indicates that the reference cell REF1 has been placed at the target location, that is, when it has been programmed an amount sufficient to pass the read '1' test.

The incremental programming of the reference cell REF1 is illustrated in FIG. 3C, in which the VTNH cell is driven by the trimmed gate voltage EXT_VCCR (step 510) while an initially native reference cell REF1 is driven by the standard gate voltage at read (step 520). The initially native reference cell REF1 exhibits signal development that is much more rapid than that of the VTNH cell, as shown by the curve "VREF1 (native)", when the cells are driven with such applied gate voltages. That curve fails to read '1,' and so the process of FIG. 5 continues by applying one or more program pulses to the reference cell REF1 at step 530. These program pulses have the effect of partially programming the reference cell and reducing its rate of signal development. That is reflected in the curve "VREF1 (partial PGM'ing)", which also fails to read '1.' Consequently, additional program pulses are applied at step 530 and the test at step 540 is repeated, and this loop continues until a PASS read '1' is detected, namely, when the signal development at the reference cell REF1 is akin to the curve "VREF1 (done PGM'ing)". Of course, different tests can be arranged to provide a boundary condition to gauge when to stop programming the reference cell (e.g., external read of the cells currents, or other tests).

The process flow of FIG. 5 permits the reference cell REF1 to be positioned in the vicinity of the target; however, since each program pulse increments the VT of the reference cell by a predetermined amount, the actual VT of the reference cell after being programmed by the process flow of FIG. 5 is typically above the target level. Consequently, if further reference cells REF2 . . . REFx are to be programmed relative to the VT of that reference cell REF1, e.g., relative to the RD_REF reference cell, then knowledge of the actual level of the REF1 threshold voltage, e.g., VT_RD_REF_actual, may be desired. The VT level of the reference cell REF1 relative to the VTNH cell can be refined by iteratively decreasing EXT_VCCR starting from EXT_VCCR=VCCR−M by a controlled amount which is a smaller value than the VT increment as a result of a programming pulse.

FIG. 6 illustrates a process flow for refining the position of reference cell REF1. It should be understood that the just-programmed reference cell itself is not being partially erased, but rather the trimmable voltage source EXT_VCCR is adjusted so that the actual VT of the reference cell REF1 can be more accurately determined.

At step 610, the VTNH cell is driven with EXT_VCCR, that is with the voltage value that was applied at step 510 described above. Namely, $$EXT\_VCCR = VCCR - M$$

Meanwhile, at step 620, the reference cell REF1 is driven with a standard gate voltage VCCR. At step 630, a counter N is set to zero for use in flow of FIG. 6 to monitor the number of times that the trimmable voltage source has been trimmed a prescribed amount. Other techniques can be used as will be appreciated for tracking the number of adjustments or the overall adjustment to the voltage source EXT_VCCR.

At step 640, the voltage value of EXT_VCCR is decreased by a prescribed amount K, which amount is preferably 50 mV or less, and at step 650 the counter N is incremented. At step 660 the VTNH array cell is read against the reference cell REF1 and a test is made to determine whether the result is PASS read '1'. It is expected that in the first loop that the VTNH cell will pass this test, with the process flow looping to step 640 to again decrease the voltage value of EXT_VCCR and then increase the counter N (at step 650). Ultimately, however, EXT_VCCR will be reduced such that the VTNH cell no longer passes the read '1' test, and, at that point, the actual VT of the reference cell REF1 is determined at step 670 to be:

$$VT\_REF1\_actual = VTNH + VCCR - EXT\_{VCCR} \qquad (1)$$

Expressed another way, the actual VT of the reference cell REF1 is:

$$VT\_REF1\_actual = VTNH + M + N*K,$$

where N is the number of loops in which the voltage value emanating from the EXT_VCCR source was decreased by the constant amount K.

A further process flow can be used in like manner to increment EXT_VCCR from its new-found value to a higher value by selecting a new voltage interval E, where E<K (e.g., E is 25 mV or less). Yet a further process flow can again decrement EXT_VCCR, and so on, to more accurately place the threshold voltage of the reference cell REF1.

Figure 7:
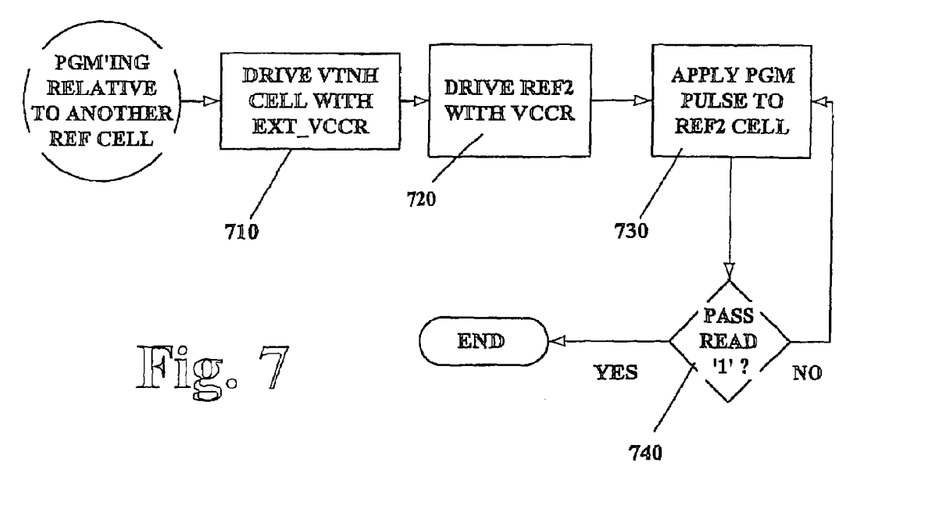
FIG. 7 illustrates a process for programming a reference cell relative to another reference cell.

With reference now to the flow diagram of FIG. 7, the steps taken for programming further reference cells REF2 ... REFx relative to the reference cell REF1 is described. Preferably, the actual threshold voltage of the reference cell REF1 has been identified through the process flow of FIG. 6. In this first preferred embodiment, the reference cells are located relative to the VTNH cell, which was located in connection with the process flow of FIG. 4, described above.

The threshold voltage for the reference cell REF2 is to be placed at:

$$VT\_REF2=VT\_REF1\_actual+M2, \quad (2)$$

where M2 is the margin between REF1 and REF2. M2 can be positive or negative. If the threshold voltage of the reference cell REF2 is lower than that of the reference cell REF1, then M2 is a positive voltage value; otherwise, M2 is a negative voltage value. For example, if REF1 is the RD_REF cell and REF2 is the RV_REF cell, then the margin M2 is XM, as shown in FIG. 2A. For the EV_REF cell in FIG. 2A a negative M2 margin (EM) should be used. Using equation (1) to solve equation (2) for EXT_VCCR, we see that $$EXT\_VCCR=VCCR-VT\_REF1\_actual+VTNH-M2$$

$$EXT\_VCCR=VCCR-M1-N*K-M2$$

Where, M1 is the original target margin of the REF1 reference cell, N*K is the amount of over programming introduced to the REF1 cell past the original target, and M2 is a positive or negative target margin between the REF1 and REF2 threshold voltages.

For example, if REF2 to be programmed relative to REF1 is the EV_REF cell shown in FIG. 2A then M2=−EM, i.e., a negative margin. Similarly, if REF2 is the RV_REF cell shown in FIG. 2A then M2=XM, i.e., a positive margin.

Thus, to place REF2 relative to REF1, the gate of the VTNH cell is driven by EXT_VCCR while the gate of REF2 is driven by the standard voltage VCCR, as indicated at steps 710 and 720, respectively. At step 730, a program pulse of a predetermined amount is applied to the reference cell REF2 to move it from its native state and place it at its target programmed state relative to REF1. The cell REF2 is being placed relative to REF1 by sensing its value relative to the VTNH cell, while the VTNH cell is driven by a gate voltage which places the VTNH signal taking into account the actual placement of REF1 and the required margin between the respective VTs of REF1 and REF2. At step 740, the partially programmed reference cell REF2 is tested to see if it still passes a read '1' test, in which case it has not been sufficiently programmed to place it M2 from the reference cell REF1. If the cell fails the read '1' test, as is initially expected since both cells are essentially native, then a further program pulse is applied at step 730 and the test at step 740 is repeated until the reference cell REF2 fails the read '1' test. At that point, the target placement for REF2 has been achieved.

As described above in connection with the target programming of the reference cell REF1, a more accurate location of the actual placement of the reference cell REF2 can be achieved using a process flow as in FIG. 6, this time applied to the reference cell REF2 and this time setting the actual VT at step 650 to be:

$$VT\_REF2=VTNH+M1+N1*K+M2+N2*K.$$

This refinement may be necessary if the reference cell REF2 is to be used for placing yet a further reference cell, or for other purposes, such as accurate monitoring of the reference cell retention loss after bake.

Further programming of reference cells will follow one of the flows described above, depending if they are programmed relative to the VTNH cell or relative to another, already programmed, reference cell.

It is know in the art that, after manufacturing, memory devices are tested to detect malfunctioning or marginal devices. As part of these tests the array cells may be programmed and then the device is introduced to a relatively high temperature cycle. After this high temperature cycle, the threshold voltage of the array cells may drop by some amount. This threshold voltage drop is known as the "retention loss." Since the reference cells are also programmed, their threshold voltage may also drop by some amount (which may be different than that of the array cells due to differences in the programming levels of the array cells and the reference cells). Since the threshold voltages of all the programmed memory cells are affected, whether a reference cell or an array cell (including the VTNH cell), there is no relative way to determine the cell's state. A non-relative way to determine the cells threshold voltage state, such as by an external measurement of the cells currents, is very expensive in terms of test time. Thus, an internal relative measurement of the array cells and the reference cells threshold voltages is desired.

A native cell which has never been programmed and which is on-board the same die is utilized to provide an internal relative measurement, in accordance with another aspect of the present invention. This native cell, referred to herein as a "golden cell" or "golden bit," permits the internal read mechanism to be used not only for the reference cells' programming flow as described above in connection with FIGS. 4-7, but also for detection of array cell and reference cell threshold voltage changes after a high temperature cycle. The process flows described above can each be modified such that the reference cells' signal placements are performed relative to this golden bit in conjunction with the native cell having the maximum threshold voltage (that is, the VTNH cell). Now, even after a high temperature cycle, the reference cells' threshold voltages can be re-estimated against the golden bit because the threshold voltage of this unprogrammed (native) cell does not change as a result of any high temperature cycle(s).

Figure 8A:
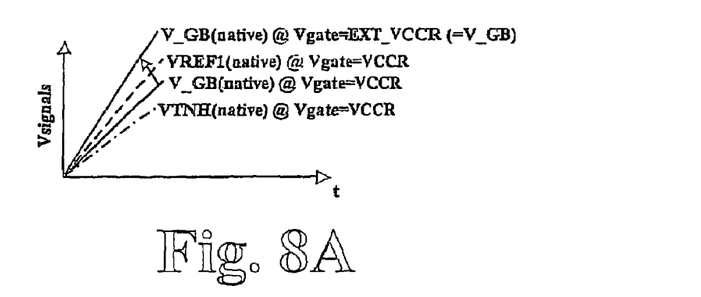
FIG. 8A plots signal development for a "golden bit" cell when driven by a trimmable external supply voltage, together with the VTNH cell and an exemplary reference cell.
Figure 8B:
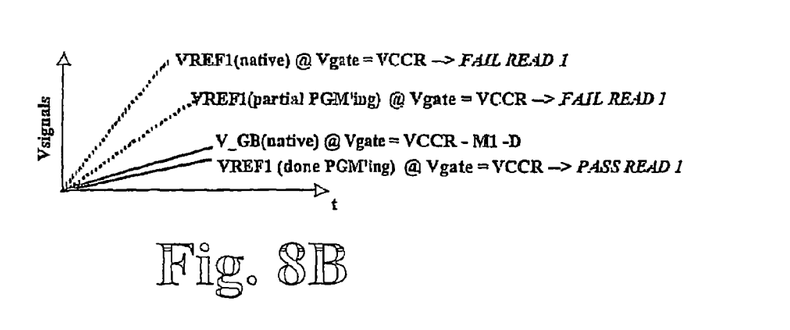
FIG. 8B is the plot of FIG. 8A, showing the reference cell at various program states relative to a golden bit's signal development that has been placed using the trimmable external supply voltage and the results of various read operations.

The golden bit is a memory cell having the same size, the same environment, similar loads and matched or similar access paths as an array memory cell. However, the golden bit is usually not among the memory cells in the memory array, but rather is typically included in an auxiliary array. Referring back to FIG. 4A, the process flow for locating the VTNH cell, the V_VTNH voltage level found at step 462 is the EXT VCCR level at which the VTNH cell signal just passed a read '1' (i.e., became higher than) the reference cell signal. FIG. 8A plots signal development for the golden bit cell when driven by the trimmable external supply EXT_VCCR, together with the VTNH cell and an exemplary reference cell. In particular, the native golden bit signal can be placed by trimming the voltage applied to its gate using a method similar to that of FIG. 4A for finding V_VTNH. The voltage value of a trimmable gate voltage source EXT_VCCR is adjusted until the golden bit just passes a read '1' test, and that defines the value of V_GB. The difference D between the gate voltages applied to the VTNH cell and the golden bit cell, $$D_{VTNH-GB} = V\_VTNH - V\_GB$$

can be used to program the reference cells and to now determine the actual threshold voltages of the programmed reference cells relative to the golden bit instead of the VTNH cell. As shown in FIG. 8B, reference cells can be programmed relative to the golden bit using a target threshold voltage level of:

$$VT\_REF1 = VTNH + M1.$$

The method consists of placing the golden bit signal at the target place of the programmed reference cell, applying a programming pulse to the reference cell, and reading the contents of the cell to determine its contents. These steps are repeated until a PASS read '1' is detected, as described above in connection with FIGS. 4-7. Thus, the flow is as described above for programming the reference cell using the VTNH cell, except that in the previous discussion the VTNH cell signal was placed at the target place of the programmed reference cell whereas now the golden bit cell's signal is placed at the target place of the programmed reference signal. The golden bit cell's signal is placed by driving its gate with $$EXT\_VCCR = VCCR - M1 - D_{VTNH-GB}.$$

Preferably, the reference cells are contained in a reference unit which includes a selector that can select which of several reference cells to use for a given operation, wherein each reference cell is programmed as described above to a prescribed level.

If the reference cells are NROM cells, they can be used as either single or two bit cells. When used as single bit cells one of the two bits in the cell is programmed as explained above while the other bit can be maintained native, programmed or erased. On the other hand, if the two bits of the NROM reference cell are used as references, then each of them is programmed as explained above.

Persons skilled in the art will appreciate that the present invention is not limited to what has been particularly shown and described hereinabove. Rather the scope of the present invention is defined only by the claims which follow.

We claim:

1. A method for programming a set of reference cells for use in performing respective read operations on an integrated circuit memory having a plurality of memory cells, comprising the steps of:
   i) driving a golden cell on the die with a predetermined external gate voltage value;
   ii) determining a placement for a reference voltage read signal relative to the golden cell;
   iii) placing a reference voltage erase verify signal relative to the reference voltage read signal; and
   iv) placing a reference voltage program verify signal relative to the reference voltage read signal.

2. The method as in claim 1, wherein the predetermined external gate voltage value is the difference D between a first external gate voltage value at which the memory cell in the array which has the highest native threshold voltage value (VTNH) just passes the first preselected read operation and a second external gate voltage value at which a golden cell on the die cell just passes the first preselected read operation (V_GB).

* * * * *